US007327163B2

United States Patent
Chauhan et al.

(10) Patent No.: US 7,327,163 B2
(45) Date of Patent: Feb. 5, 2008

(54) VOLTAGE TRANSLATOR HAVING MINIMIZED POWER DISSIPATION

(75) Inventors: Rajat Chauhan, Uttaranchal (IN); Sunil C. Kasanyal, Uttaranchal (IN)

(73) Assignee: STMicroelectronics Pvt. Ltd., Noida (IN)

( * ) Notice: Subject to any disclaimer, the term of this patent is extended or adjusted under 35 U.S.C. 154(b) by 0 days.

(21) Appl. No.: 11/110,654

(22) Filed: Apr. 20, 2005

(65) Prior Publication Data

US 2005/0237084 A1    Oct. 27, 2005

(30) Foreign Application Priority Data

Apr. 21, 2004    (IN)    .......................... 761/DEL/2004

(51) Int. Cl.
*H03K 19/094* (2006.01)
*H03K 19/0175* (2006.01)

(52) U.S. Cl. .............................. 326/68; 326/80; 326/81

(58) Field of Classification Search ............ 326/80–81, 326/68; 327/333
See application file for complete search history.

(56) References Cited

U.S. PATENT DOCUMENTS

| 4,532,436 A | * | 7/1985 | Bismarck | .................... 327/208 |
| 5,422,523 A |   | 6/1995 | Roberts et al. | |
| 2005/0012537 A1 | * | 1/2005 | Lee | ........................... 327/333 |

* cited by examiner

*Primary Examiner*—Anh Q. Tran
(74) *Attorney, Agent, or Firm*—Gardere Wynne Sewell LLP

(57) ABSTRACT

A voltage translator circuit for low level to high level voltage translation includes a plurality of transistors coupled to an inverter for receiving a common input signal at an input node of the plurality of transistors and passing a translated output signal to the output node of the plurality of transistors. A latch circuit is connected between a first node at the output node of the plurality of transistors and a second node that is connected to a feedback element at an input side of the plurality of transistors to form a feedback circuit that minimizes static power dissipation.

12 Claims, 4 Drawing Sheets

Cond.1 - Fast NMOSs, Fast PMOSs, Supply voltage 3.6V, Temprature 0 deg.C
Cond.2 - Typical NMOSs, Typcal PMOSs, Supply voltage 3.3V, Temprature 25 deg.C
Cond.3 - Fast NMOSs, Slow PMOSs, Supply voltage 3.0V, Temprature 100 deg.C
Cond.4 - Slow NMOSs, Slow PMOSs, Supply voltage 3.0V, Temprature 100 deg.C
Cond.5 - Slow NMOSs, Fast PMOSs, Supply voltage 3.6V, Temprature 0 deg.C Cond.1 - Fast NMOSs, Fast PMOSs, Supply voltage 3.6V, Temprature 0 deg.C
Cond.2 - Typical NMOSs, Typcal PMOSs, Supply voltage 3.3V, Temprature 25 deg.C
Cond.3 - Fast NMOSs, Slow PMOSs, Supply voltage 3.0V, Temprature 100 deg.C
Cond.4 - Slow NMOSs, Slow PMOSs, Supply voltage 3.0V, Temprature 100 deg.C
Cond.5 - Slow NMOSs, Fast PMOSs, Supply voltage 3.6V, Temprature 0 deg.C

VOLTAGE TRANSLATOR HAVING MINIMIZED POWER DISSIPATION

PRIORITY CLAIM

The present application claims priority from Indian Application for Patent No. 761/Del/2004 filed Apr. 21, 2004, the disclosure of which is hereby incorporated by reference.

BACKGROUND OF THE INVENTION

1. Technical Field of the Invention

The present invention generally relates to the field of voltage level translator circuits. In particular it relates to an improved low to high-level voltage translator where the difference between core and I/O supply voltage is very large.

2. Description of Related Art

Advancements in semiconductor fabrication and manufacturing techniques have led to reduction in operating voltage levels. One reason to use lower operating voltage levels is to reduce the power consumption of a semiconductor chip.

Considering the case where the chip is interfaced with bus standards based on higher voltage levels, only the main bulk (or core) of the chip is operated at the lower voltage level while the I/O interface of the chip is operated at a higher voltage level(s). In order to implement such a scheme it is required to translate high voltage I/O signals to low voltage core signals and low voltage core signals to high voltage I/O signals.

One main problem experienced while translating low voltage core signals to high voltage I/O signals relates to direct current paths causing power dissipation. If a low voltage signal is used to drive a device operating at higher voltage, it can cause the device to draw D.C. power since it is neither fully off nor fully on. Thus, circuitry is required for translating voltage signals which can minimize D.C. current problems and thus minimize power dissipation.

FIG. 1 shows a prior art translating circuitry that is an embodiment of U.S. Pat. No. 5,422,523, the disclosure of which is hereby incorporated by reference.

This translator circuitry gives good results when the voltage difference is small, but starts malfunctioning and even fails completely when the difference between the higher and lower supply voltages is large.

FIG. 2 shows the simulation results of the prior art circuitry of FIG. 1 for a higher supply voltage VCC equal to 3.3 V and a lower supply voltage equal to 1.2 V. The output OUT of the translating circuitry is shown for five different operating conditions (as mentioned in FIG. 2 itself). It can be seen that for Condition 1, Condition 2 and Condition 3 the output is acceptable, but for Condition 4 the output becomes distorted and for Condition 5 there is no output (constant low).

The reason for the failure of the circuit is the cross-coupled gates using regenerative feedbacks. In this circuit, switching is initialized by the input signal IN and finally controlled and concluded by regenerative feedback. Switching initialization by the input IN has to ensure that some threshold voltage is reached at the nodes OUT and X before switching is handed over to regenerative feedback. If the initialization process is weak, then the translator circuit will switch late or will not switch at all, and the output OUT will become either distorted or stuck on one state (high or low).

For example, when input IN is at low state, N12 is off, N11 is on, node OUT is at logic low and P12 is on, node X is at logic high and P11 is off. It is to be noted the NMOS transistors N11 and N12 are driven by the lower supply voltage and PMOS transistors P11 and P12 are driven by the higher supply voltage. Now, when input IN switches from low to high, N12 will switch on and will try to pull-down node X. But in order to pull-down this node N12 has to fight with perfectly turned on PMOS P12. In turn, PMOS P12 will not switch off unless node X goes low effectively. In this case, if N12 is not strong enough to pull-down the node X effectively, the output node OUT will not be pulled-up but will get stuck on logic low.

The same thing may happen in the case of a high to low transition, where N11 has to fight with P11 to pull-down the node OUT. If N11 is not strong enough, output node OUT will not be pulled-down but will get stuck on logic high.

This condition is very likely to occur in the case where the difference between the higher and lower supply voltages is large, as is the case of the example shown in FIG. 2. Referring to the example where a lower supply voltage is 1.2 V and a higher supply voltage is 3.3 V, NMOSs N11, N12 will be switched on with Vgs equal to 1.2 V while PMOS transistors P11, P12 are on with Vgs equal to −3.3 V. The magnitude of the NMOS transistors 'on' voltage is very small compared to that of the PMOS transistors; this makes them very weak. Therefore the sizes of the NMOS transistors have to be kept relatively very large to ensure proper functioning. But despite the large size of NMOS transistors, the circuitry still remains very uncertain with variation in operating conditions. When sized nicely to give good results in one operating condition, the circuit gives distorted signals or even no signal in other operating conditions. This can seen from FIG. 2, wherein the circuitry gives good results in Condition 2, gives a distorted signal for Condition 4 and no signal in Condition 5.

The situation becomes even worse when there are bounces on the ground plane. The FIG. 1 translator circuitry is most likely to be used in I/O circuitry, which are inherently noisy. So ground bounce will be a very common event in this circuitry. If ground bounce occurs at the time of input transitions, the effective Vgs of NMOSs will be reduced, thus weakening the transistors further and causing signal distortion.

The situation of having a large difference between higher and lower supply voltages frequently arrives in the case of FPGAs (Field Programmable Gate Arrays) as they are often used for various applications and are therefore interfaced with various devices operating at varied bus standards. Due to the vast and diverse field of applications of FPGAs it becomes desirable to have their I/O interface circuits capable of being programmed to operate at various voltage levels.

In reference to the problems discussed above, there exists a need for a voltage translator circuit that does not have any D.C. current paths so as to minimize power dissipation.

SUMMARY OF THE INVENTION

Embodiments of the present invention obviate the shortcomings of the prior art and provide an improved voltage translator having minimized power dissipation. Such embodiments provide an improved voltage translator having a feedback circuit to block all the D.C. current paths during input signal transitions for minimizing power dissipation. Such embodiments further provide a voltage translator having minimum power dissipation with reduced area.

In accordance with an embodiment of the present invention, a voltage translator comprises: a plurality of transistors, receiving a common input signal at an input node of said plurality of transistors and passing the voltage translated output signal at an output node of said plurality of transistors, wherein, a latch circuit is connected at a first node to the output node of said plurality of transistors, and a feedback element is connected between a second node of said latch circuit and an input side of said plurality of transistors to form a feedback circuit to minimize power dissipation.

The latch circuit comprises at least two inverters coupled to form a closed path and said feedback element is a PMOS or NMOS transistor. The plurality of transistors comprises PMOS or NMOS transistors.

An embodiment of the invention further relates to a method for providing an improved voltage translator having minimized power dissipation. The method comprises: inputting a common signal to a plurality of transistors and outputting the voltage translated output signal at the output node of said plurality of transistors, connecting a latch circuit between said output node and a feedback element, and sending a feedback signal from said latch circuit to said plurality of transistors to reduce the power dissipation.

Advantageously, embodiments of the present invention provide for an improved voltage translator with minimized power dissipation and which occupies minimum chip area.

In an embodiment of the invention, a circuit comprises a level shifter receiving an input signal at lower voltage levels and outputting an output signal at higher voltage levels. A latch has an input connected to the output of the level shifter and further has an output. A feedback transistor has a first conduction terminal connected to the level shifter and a second conduction terminal connected to a reference voltage, wherein a gate of the feedback transistor is connected to the output of the latch.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 3:
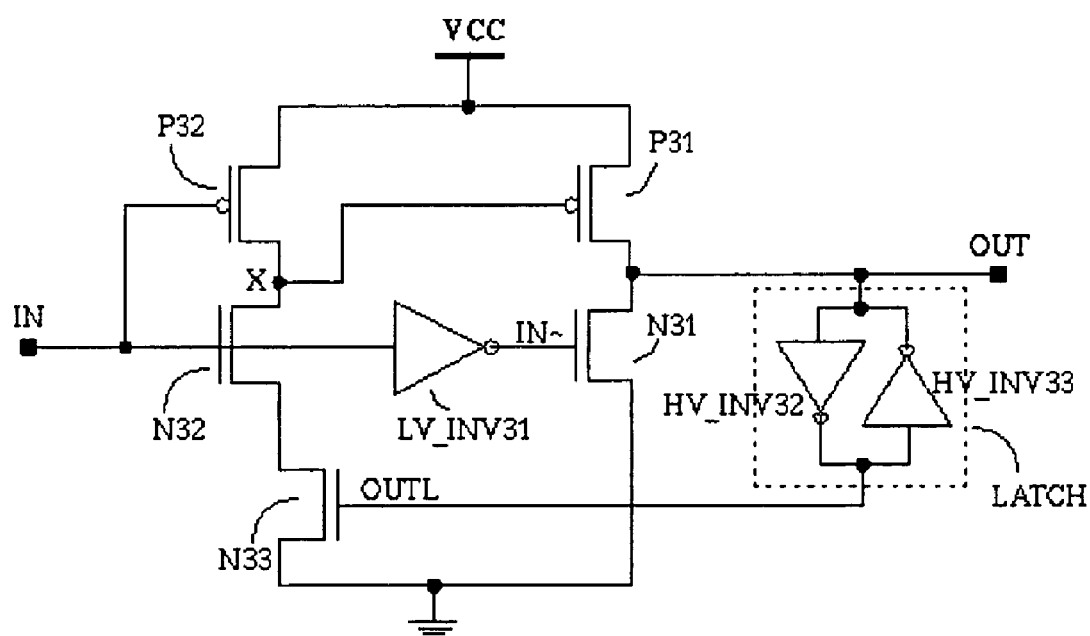
FIG. 3 shows the voltage translator circuit according to the present invention.

FIG. 3 shows an embodiment of the translator of the present invention. Signal IN is a low voltage swing input signal to the translator. The high voltage swing output of the translator is at node OUT. VCC is a higher voltage power supply. Inverter LV_INV31, which is connected between nodes IN and IN~, operates at a lower voltage (core) power supply. The signal IN~ is the complementary of input signal IN and has same voltage swing as signal IN. All other transistors and inverters in the circuitry operate at the higher voltage power supply of the I/Os.

The gate of PMOS transistor P32 is connected to IN, while the drain is connected to node X and the source is connected to the I/O power supply VCC. The gate of PMOS transistor P31 is connected to node X, while the drain is connected to output node OUT, and the source is connected to the I/O power supply VCC. The NMOS transistor N32 has its gate connected to input IN, while the source is connected to the drain of NMOS transistor N33 and the drain is connected to node X. The NMOS transistor N33 has its gate connected to node OUTL, while the drain is connected to the source of transistor N32 and the source is connected to the ground potential. The gate of transistor N31 is connected to signal IN~, while the drain is connected to the output OUT and the source is connected to ground. Two inverters HV_INV32 and HV_INV33 form a LATCH. This LATCH is connected between the output terminal OUT and node OUTL.

For the ease of explanation, it is assumed here that the lower core supply voltage is 1.2V and the I/O voltage VCC is 3.3V. The translator circuitry of FIG. 3 accordingly translates a 1.2V core signal into a 3.3 V I/O signal. The operation of the translator is explained in two separate sections for a high-to-low and a low-to-high transition of input signal IN.

High-to-low transition of the signal IN: Before high-to-low transition of input signal IN, it is at logic high (1.2V). Output OUT is also at logic high (3.3V) and OUTL at logic low. NMOS transistor N33 is completely off because the OUTL voltage is 0V and the gate of NMOS transistor N32 is driven by 1.2V. PMOS transistor P32 is partially on because its gate voltage is 1.2V and source is at 3.3V. Being partially on, P32 keeps node X pulled to 3.3V.

It is to be noted here that although the gate of NMOS transistor N32 is connected to 1.2V, the ground path to node X remains blocked as series connected NMOS transistor N33 is completely off. Node X, being at 3.3V, keeps PMOS transistor P31 completely off. NMOS transistor N31 is also completely off as signal IN~ is at logic low. Logic high (3.3V) at the output OUT is maintained by the LATCH operating at high I/O supply voltage. So in this steady state situation, no D.C. path to ground exists, thus nullifying D.C. power dissipation. Also, both output transistors P31 and N31 are off and signal status at output OUT is maintained by the LATCH.

When signal IN goes high-to-low (1.2V to 0V), transistor P32 becomes on (Vgs=−3.3V) and transistor N32 becomes off (Vgs=0V). But this event does not do much of the job as the voltage at node X is already at 3.3V and transistor P31 is already completely off (Vgs=0V).

Operation during high-to-low transition is controlled by NMOS transistor N31, which has its gate connected to signal IN~. When signal IN goes high-to-low, signal IN~ goes low-to-high (0V to 1.2V) thus switching on NMOS transistor N31 that discharges output terminal OUT to ground.

It is important to point out here that when transistor N31 discharges the output terminal OUT to ground, it does not race with any partially or fully on PMOS transistor because transistor P31 is completely off. Notably, this was not the case in prior art and was the main cause of its operational problems. (Note: it is assumed that the PMOS transistors used in the LATCH are very weak compared to N31). When OUT goes low, node OUTL goes high (3.3V), which turns NMOS transistor N33 completely on (Vgs=3.3V), but transistor N32 is still off.

So, after high-to-low switching, when input signal IN reaches a steady state logic low, again there is no D.C. path to ground, and therefore no static power dissipation in the translator.

Low-to-high transition of signal IN: As described already, when signal IN is at steady state logic low, OUT is at 0V, node OUTL is at 3.3V, and node X is at 3.3V. Transistors N32 and P31 are completely off, and transistors P32, N31 and N33 are on.

When IN changes from low-to-high (0V to 1.2V), NMOS transistor N32 turns on but transistor P32 does not get completely turned off, and as transistor N33 is already on, this will create a current path between VCC and ground through transistors P32, N32 and N33. But, PMOS transistor P32 is kept extremely weak, so the driving strength of the ground path (transistors N32 and N33) is greater than the strength of the supply path (transistor P32). So node X discharges close to 0V, which turns transistor P31 on. Since signal IN~ is 0V, NMOS transistor N31 is off. Transistor P31 drives OUT to 3.3V. As OUT becomes 3.3V, node OUTL becomes 0V, which turns NMOS transistor N33 off. As transistor N33 turns off, again all D.C current paths are blocked and there is no static power dissipation, also node X will be pulled back to 3.3V through partially on PMOS transistor P32. This will turn off transistor P31 and OUT will remain latched at 3.3V.

So after low-to-high switching, when input signal IN reaches a steady state logic high, again there is no static power dissipation in the translator. Also as transistor P31 is off, transistor N31 will easily pull down node OUT in the next high-to-low transition.

In the low-to-high transition case, a weak PMOS transistor P32 is sufficient to pull back the node X to 3.3V when transistor N33 goes off. This is because a fast rise of voltage at node X is not required as PMOS transistor P31 is desired to go completely off at any time before the next high-to-low transition at signal IN. So, as described earlier, a partially on weak PMOS transistor P32 will not interfere with pulling down node X through NMOS transistors N32 and N33.

It is to be noted that, when signal IN goes from 0V to 1.2V, transistor P31 is on. As OUT becomes 3.3V, node OUTL becomes 0V, which turns transistor N33 off. So, the ground path from node X is now off and PMOS transistor P31 is partially on (gate voltage is 1.2V), which pulls node X to 3.3V and turns PMOS transistor P31 off. During this period, the LATCH keeps the output voltage at 3.3V until the next transition from logic high to logic low occurs. The size of inverters HV_INV32 and HV_INV33 should be sufficient to latch the output. So, when transistor N31 discharges the output terminal OUT, it can easily override the latched voltage.

Figure 4:
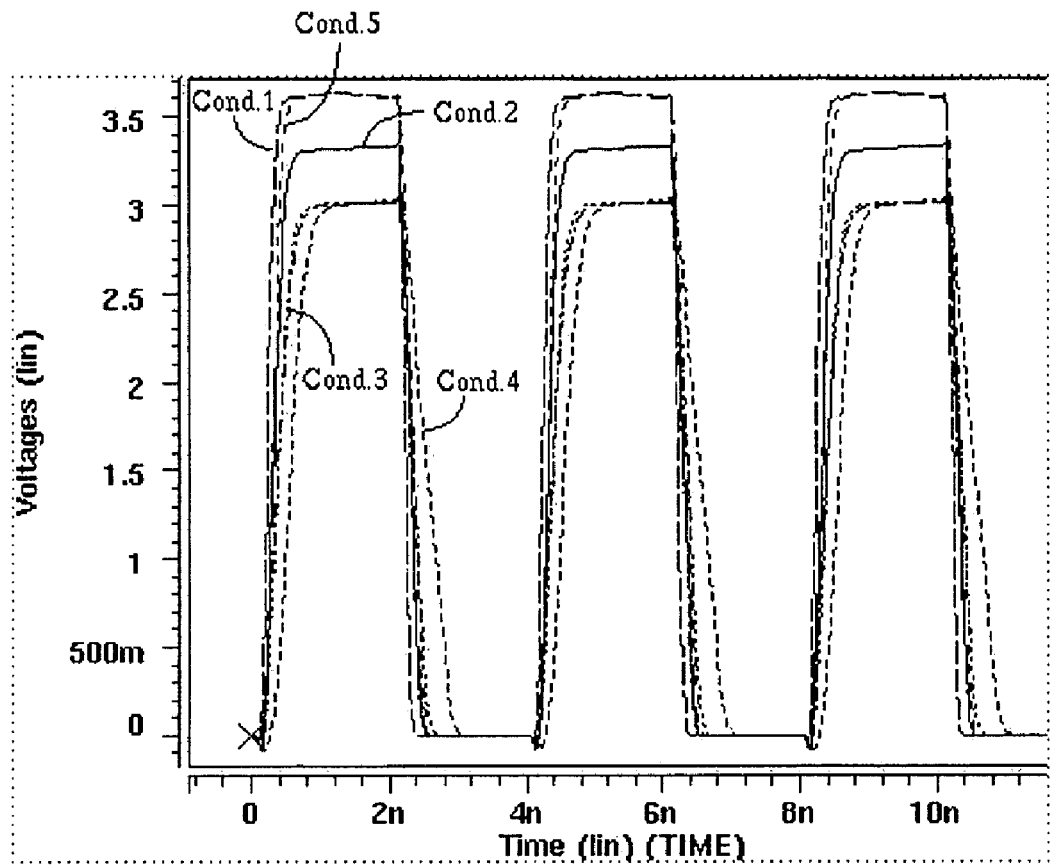
FIG. 4 shows the simulation results of the instant invention in different operating conditions for 1.2V to 3.3V translation.

FIG. 4 shows the simulation results of the translator of FIG. 3 for various operating conditions. The translator is sized so that it gives the same output results as given by the translator of FIG. 1 under the conditions of supply voltage at 3.3V and a temperature at 25° C. The variation in output results with the translator of present invention is less in comparison to the variations shown by the prior art translator of FIG. 1. Thus, power dissipation is less with the instant invention.

In the present invention complete switching of the translator is controlled by input signal IN and not by any feedback (as is the case in prior art). Feedback in the present invention is used only to block D.C. current paths. So, problems faced in the prior art translator are not seen in present invention.

Although the present invention is described in reference to FPGAs for translating low to high voltage swing signals, where voltage difference is large, it can applied to all the application in CMOS ICs where low to high voltage level translation is required.

Figure 1:
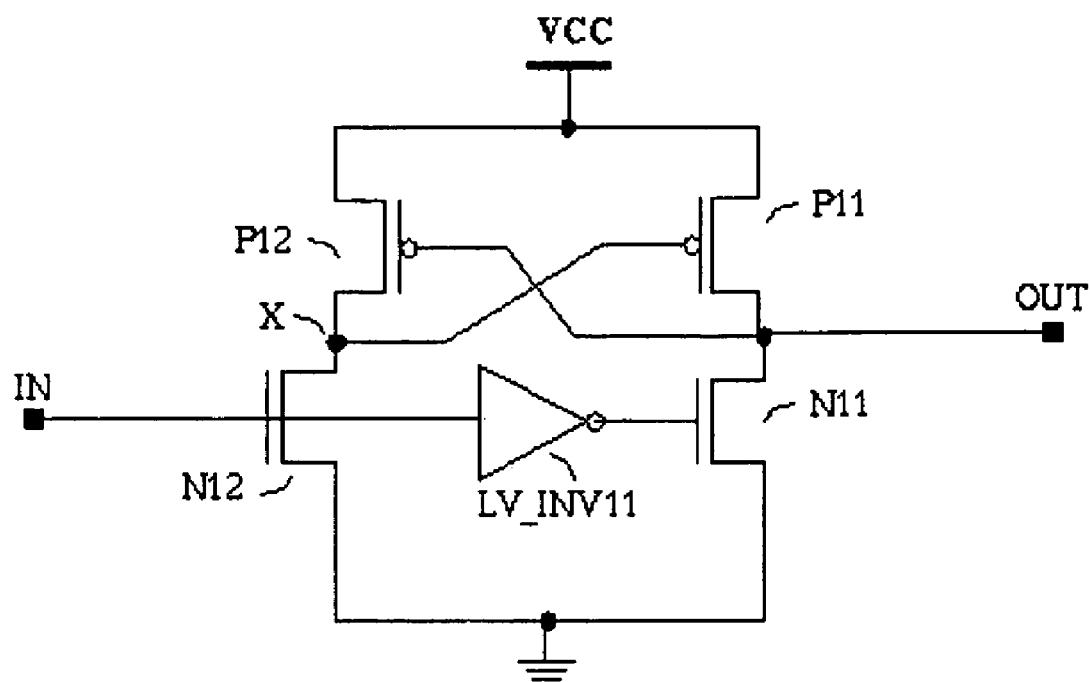
FIG. 1 shows the prior art voltage translator circuit.
Figure 2:
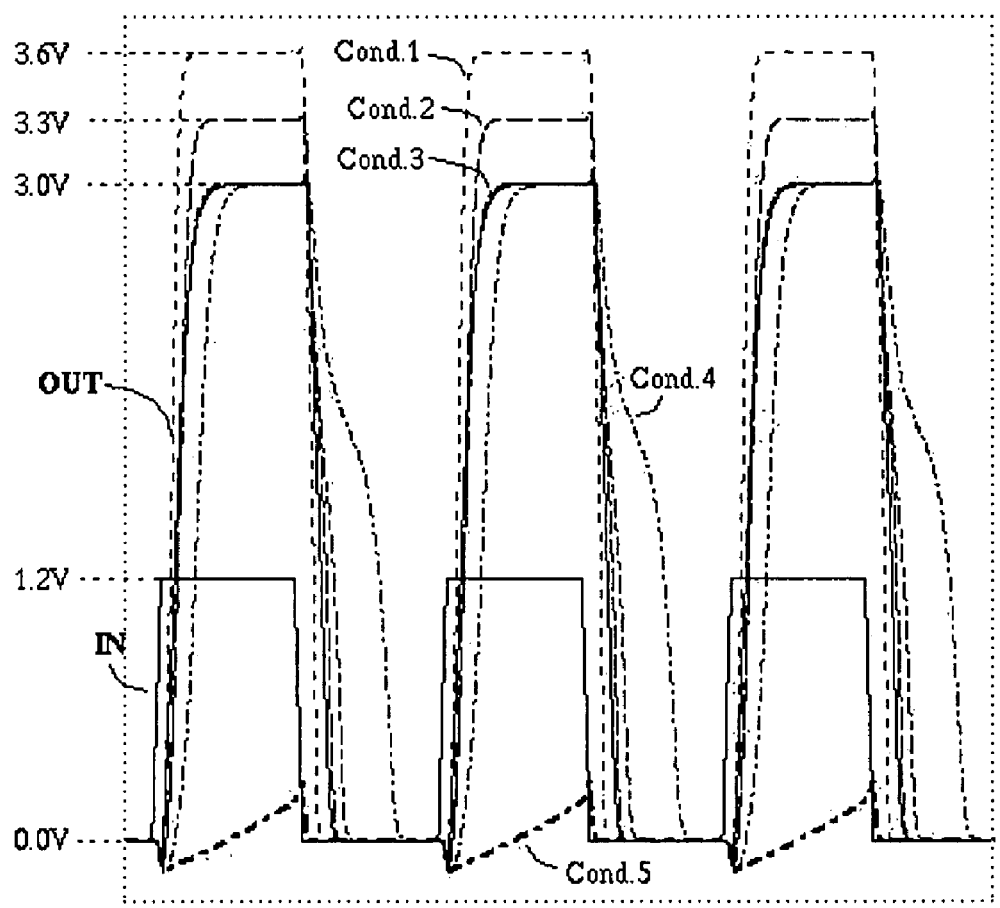
FIG. 2 shows the prior art simulation results in different operating conditions for voltage translation of 1.2V to 3.3V.

The following tables illustrate simulation results of the prior art voltage translator of FIG. 1 and the translator of the present invention in FIG. 3. For the translator circuits, delays in typical operating conditions are matched and then performance in different operating conditions is compared:

Simulation results of prior art:

TABLE 1

| Operating Conditions | Rising delay (ns) | Falling delay (ns) | Power Dissipation (Mw) | Total PMOS size | Total NMOS size |
|---|---|---|---|---|---|
| Cond. 1 (Fast) | 0.219 | 0.181 | 0.975 | 20 u | 70 u |
| Cond. 2 (Typical) | 0.332 | 0.320 | 0.926 | | |
| Cond. 3 (Fast–slow) | 0.297 | 0.271 | 0.630 | | |
| Cond. 4. (Slow) | 0.585 | 1.011 | 1.032 | | |
| Cond. 5 (SF) | Failed | Failed | | | |

The translator of the prior art fails to operate for Condition 5 and gives poor response for Condition 4. In Condition 5, NMOS transistors become slow and PMOS transistors become fast which makes the situation worse because sinking NMOS transistors are turning on by Vgs=1.2V, whether the PMOS transistors are on by Vgs=−3.3 V. The same thing happens in slow conditions, where NMOS and PMOS transistors are slow and temp and voltages are also slow. In Condition 4 the falling of the output is very poor, thereby enhancing power dissipation in the circuit.

Simulation results of present invention:

TABLE 2

| Operating Conditions | Rising delay (ns) | Falling delay (ns) | Power Dissipation (mW) | Total PMOS size | Total NMOS size |
|---|---|---|---|---|---|
| Cond. 1 | 0.237 | 0.193 | 0.855 | 18.8 u | 52 u |
| Cond. 2 | 0.332 | 0.321 | 0.719 | | |
| Cond. 3 | 0.447 | 0.301 | 0.614 | | |
| Cond. 4 | 0.548 | 0.697 | 0.612 | | |
| Cond. 5 | 0.292 | 0.366 | 0.859 | | |

It can be clearly seen from the above tables that present invention gives good results in different operating conditions also even in Condition 4 and Condition 5. Power dissipation in the present invention is substantially reduced as compared to the prior art voltage translator circuit.

Therefore, we can conclude that present invention provides a voltage translator for translating lower voltage levels (as 1.2V) into higher voltage levels (3.3V) with minimized power dissipation and occupying lesser chip area.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A voltage translator, comprising:
 a plurality of transistors including an input series transistor connected branch and an output series transistor connected branch which is coupled to an output of the input series transistor connected branch, receiving a common input signal at an input node for the input series transistor connected branch of said plurality of transistors and passing a voltage translated output signal at an output node for the output series transistor connected branch of said plurality of transistors, a latch circuit connected at a first node to the output node of said plurality of transistors, and a feedback element connected in series with the input series transistor connected branch of said plurality of transistors and controlled by a second node of said latch circuit to form a feedback circuit that minimizes static power dissipation.

2. The voltage translator of claim 1, wherein said latch circuit comprises at least two inverters coupled to form a closed path.

3. The voltage translator of claim 1, wherein said feedback element is a PMOS or NMOS transistor.

4. The voltage translator of claim 1, wherein said plurality of transistors comprises PMOS or NMOS transistors.

5. A circuit, comprising:

a first p-channel and n-channel series connected transistor pair having a first common drain node, wherein gate terminals of the first connected transistor pair receive an input signal at lower voltage levels;

a second p-channel and n-channel series connected transistor pair having a second common drain node defining an output of the circuit at higher voltage levels, wherein a gate terminal of the p-channel is connected to the first common drain node, and a gate terminal of the n-channel is connected to receive an inverted version of the input signal;

a latch having a first signal terminal and a second signal terminal, wherein the first signal terminal is connected to the output at the second common drain node; and a feedback transistor coupled between the first connected pair and a reference voltage, a gate terminal of the feedback transistor connected to the second signal terminal of the latch.

6. The circuit of claim 5 further including an inverter circuit to form the inverted version of the input signal.

7. The circuit of claim 5 wherein the feedback transistor is an n-channel whose source is connected to a ground reference and whose drain is connected to a source of n-channel in the first connected transistor pair.

8. The circuit of claim 5 wherein the latch comprises at least two inverters coupled input to output, one input/output defining the first signal terminal and another input/output defining the second signal terminal.

9. A circuit, comprising:

a level shifter receiving an input signal at lower voltage levels and outputting an output signal at higher voltage levels, the level shifter including a p-channel and n-channel series connected transistor pair connected between a first voltage reference supply and a feedback node, wherein gate terminals of the connected transistor pair receive the input signal at lower voltage levels;

a latch having an input connected to the output of the level shifter and having an output;

a feedback transistor having a first conduction terminal connected to the feedback node of the connected transistor pair and a second conduction terminal connected to a second voltage reference supply, wherein a gate of the feedback transistor is connected to the output of the latch.

10. A circuit, comprising:

a level shifter receiving an input signal at lower voltage levels and outputting an output signal at higher voltage levels;

a latch having an input connected to the output of the level shifter and having an output;

a feedback transistor having a first conduction terminal connected to the level shifter and a second conduction terminal connected to a reference voltage, wherein a gate of the feedback transistor is connected to the output of the latch, wherein the level shifter comprises:

a first p-channel and n-channel series connected transistor pair having a first common drain node, wherein gate terminals of the first connected transistor pair receive the input signal at lower voltage levels; and a second p-channel and n-channel series connected transistor pair having a second common drain node defining an output of the circuit at higher voltage levels, wherein a gate terminal of the p-channel is connected to the first common drain node, and a gate terminal of the n-channel is connected to receive an inverted version of the input signal.

11. The circuit of claim 9 wherein the feedback transistor is an n-channel whose source is connected to a ground reference as the second reference supply and whose drain is connected to a source of the n-channel transistor of the connected transistor pair in the level shifter.

12. The circuit of claim 9 wherein the latch comprises a first inverter having a first input and first output and a second inverter having a second input and a second output, the first input and second output comprising the latch input and the first output and second input comprising the latch output.

* * * * *